United States Patent [19]

Roth

[11] Patent Number: 4,544,621

[45] Date of Patent: Oct. 1, 1985

[54] PHOTOCROSSLINKABLE WATER-SOLUBLE POLYMERS, CONTAINING MALEIMIDYL AND QUATERNARY AMMONIUM GROUPS PROCESS FOR THEIR PREPARATION AND USE THEREOF

[75] Inventor: Martin Roth, Giffers, Switzerland

[73] Assignee: CIBA GEIGY Corporation, Ardsley, N.Y.

[21] Appl. No.: 492,853

[22] Filed: May 9, 1983

[30] Foreign Application Priority Data

May 19, 1982 [CH] Switzerland ............... 3128/82

[51] Int. Cl.[4] .............. G03C 1/68; C08F 226/06
[52] U.S. Cl. .............. 430/271; 430/281; 430/286; 525/375; 526/258
[58] Field of Search .............. 526/258; 525/375

[56] References Cited

U.S. PATENT DOCUMENTS

| 4,158,730 | 6/1979 | Baumann et al. | |
|---|---|---|---|
| 4,229,519 | 10/1980 | Sharp et al. | |
| 4,312,940 | 1/1982 | Nakomura et al. | 526/258 |
| 4,377,668 | 3/1983 | Zweifel et al. | 525/375 |

FOREIGN PATENT DOCUMENTS

| 21019 | 12/1980 | European Pat. Off. |
| 29358 | 5/1981 | European Pat. Off. |

OTHER PUBLICATIONS

CA, 95, 15984j, (1981).

*Primary Examiner*—Joseph L. Schofer
*Assistant Examiner*—Peter F. Kulkosky
*Attorney, Agent, or Firm*—Luther A. R. Hall

[57] ABSTRACT

Polymers containing maleimide groups and quaternary ammonium groups are soluble in water. They can be used as light-sensitive photographic recording materials which can be developed with water.

8 Claims, No Drawings

PHOTOCROSSLINKABLE WATER-SOLUBLE POLYMERS, CONTAINING MALEIMIDYL AND QUATERNARY AMMONIUM GROUPS PROCESS FOR THEIR PREPARATION AND USE THEREOF

The present invention relates to photocrosslinkable water-soluble polymers and copolymers which contain maleimidyl and quaternary ammonium groups, and to the use thereof as photographic recording material.

Photopolymers are used as photographic recording material using organic solvents and aqueous bases or acids as developers. The processing of such photopolymers suffers from the disadvantage that it necessitates the use of exhausting devices and that the working up of the developers is technically more complicated.

U.S. Pat. No. 4,229,519 and European patent application No. 0 029 358 discloses water-soluble and water-developable photocrosslinkable compositions which comprises photopolymers containing quaternary ammonium groups and ethylenically unsaturated groups. These photopolymers can only be prepared by means of an uneconomic two-step process (polymerisation and quaternisation). In addition, it is necessary to use special photoinitiator systems so as to obtain a sufficient light sensitivity. Further, such materials require inhibitors to obtain a sufficient storage stability in the dark.

It is the object of the present invention to provide water-developable photopolymers whose light sensitivity can be increased with known photoinitiators and which can be prepared in a single process step. Accordingly, the present invention relates to homopolymers and copolymers containing maleimidyl and quaternary ammonium groups and having a molecular weight of at least 1000, which polymers contain structural units of the formula I $$\begin{array}{cc} -CH_2-CR- & R^1 \\ | & | \\ O=C-Y-A-N^{\oplus}-D \; Z^{\ominus}, \\ & | \\ & R^2 \end{array} \quad (I)$$

wherein

R is a hydrogen atom or a methyl group,

Y is an oxygen atom or the —NH group,

A is a linear or branched $C_2$–$C_6$alkylene group, $R_1$ and $R_2$ independently of each other are $C_1$–$C_4$alkyl or together are tetramethylene, pentamethylene or 3-oxapentylene, D is $C_1$–$C_4$alkyl or a radical of the formula

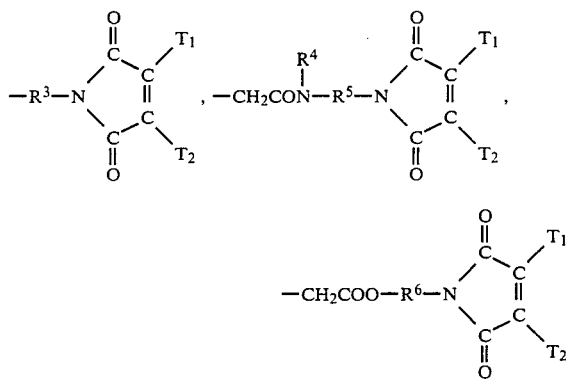

wherein $R^3$ is alkylene, oxaalkylene or benzylene, $R^4$ is a hydrogen atom or $C_1$–$C_4$alkyl, $R^5$ is a bivalent aliphatic, cycloaliphatic or aromatic hydrocarbon radical or a bivalent aliphatic or aromatic heterocyclic radical containing up to 18 carbon atoms, and $R^6$ has the meaning of $R^5$ or is

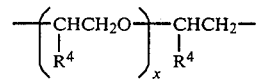

wherein x is a value from 1 to 29 and $R^4$ is hydrogen atom or $C_1$–$C_4$alkyl; and $T_1$ and $T_2$ independently of each other are $C_1$–$C_4$alkyl or together are unsubstituted or $C_1$–$C_4$alkyl-substituted trimethylyene or tetramethylene, and $Z^{\ominus}$ is an anion, with the proviso that, if D is $C_1$–$C_4$alkyl, structural units of at least one ethylenically unsaturated monomer which carries a maleimidyl group of the formula

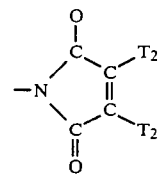

are present, and additional structural units which are derived from ethylenically unsaturated comonomers which do not contain maleimide groups may also be present.

The molecular weight may be from 1000 to 200,000, preferably from 10,000 to 100,000 and, most preferably, from 10,000 to 50,000. The copolymers are preferred.

A as linear or branched alkylene may contain preferably 2 to 4 carbon atoms and may be e.g. 1,6-, 1.5-, 1,4-, 1,3- or 1,2-hexylene, 1,5- or 1,3- or 1,2-hexylene, 1,5- or 1,3-pentylene, 1,4-, 1,3- or 1,2-propylene and ethylene. A is preferably propylene and most preferably ethylene.

$R^1$ and $R^2$ as alkyl may be linear or branched and contain preferably 1 or 2 carbon atoms. Examples are n-butyl, isobutyl, tert-butyl, n-propyl, isopropyl, ethyl and methyl. $R^1$ and $R^2$ may also be unsubstituted or $C_1$–$C_4$alkyl-substituted, especially methyl-substituted, tetramethylene, pentamethylene or 3-oxapentylene. D as $C_1$–$C_4$alkyl may have the meanings assigned to $R^1$ and $R^2$ and is preferably methyl or ethyl.

$R^3$ as alkylene may be linear or branched and contain 2 to 18, preferably 2 to 12 and most preferably 2 to 6 carbon atoms, and as oxaalkylene may contain 2 to 6, preferably 2 to 4, carbon atoms. Examples are: ethylene, 1,2-, or 1,3-propylene, 1,4- or 1,3-butylene, pentylene, hexylene, octylene, decylene, dodecylene, octadecylene, decylethylene, tetradecylethylene, hexadecylethylene and 3-oxapentylene.

$R^4$ as alkyl may be linear or branched. $R^4$ is preferably a hydrogen atom.

The radical $R^5$ preferably contains up to 12 carbon atoms. $R^5$ as an aliphatic radical is preferably linear or branched alkylene which may be interrupted by hetero atoms such as O, S and $NR^4$. The preferred significance of $R^5$ in this case is alkylene and oxyaalkylene containing 1 to 12 carbon atoms. $R^5$ as a cycloaliphatic radical preferably contains 5 or 6 ring carbon atoms and is in particular cyclopentylene and cyclohexylene, each unsubstituted or substituted by 1 to 4 $C_1$-$C_4$ alkyl groups, e.g. methyl. 1,3-Cyclohexylene and 1,4-cyclohexylene are particularly preferred.

$R^5$ as an aromatic hydrocarbon radical may be e.g. a carbocyclic aromatic radical containing preferably 6 to 16 carbon atoms or an araliphatic radical containing preferably 7 to 16 carbon atoms. Examples are 1,2-, 1,3- and 1,4-phenylene, 1,3-toluylene, 1,7- and 2,7-naphthylene, 1,2-, 1,3- or 1,4-benzylene and bicyclic aromatic groups of the formula

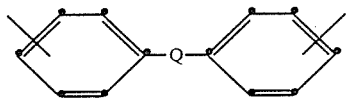

wherein Q is a direct bond, —O—, —S—, —SO—, —SO$_2$—, —CO,

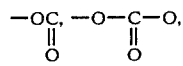

—NR$^4$—, $C_1$-$C_6$alkylene, $C_2$-$C_6$alkylidene or cycloalkylidene containing 5 or 6 ring carbon atoms. The free bonds are preferably in the 4,4'-position.

$R^5$ as a heterocyclic-aliphatic or heterocyclic-aromatic radical may contain 4 to 12 carbon atoms. Such radicals are preferably 5- or 6-membered rings containing 1 to 2 hetero atoms such as N or O.

In the polyoxaalkylene radical $R^6$, x is preferably a value from 1 to 12, most preferably from 1 to 6, and $R^4$ is a hydrogen atom or methyl.

$T_1$ and $T_2$ are preferably methyl and tetramethylene.

$Z^\ominus$ is preferably the anion of a quaternising agent such as e.g. F, Cl, Br, SO$_4$, $C_1$-$C_4$alkyl-OSO$_3$, and sulfonate. The sulfonate anion may be derived e.g. from aliphatic, cycloaliphatic and aromatic sulfonic acids, e.g. methylsulfonic, ethylsulfonic, propylsulfonic, butylsulfonic, pentylsulfonic, hexylsulfonic, cycloheylsulfonic, phenylsulfonic, benzylsulfonic, toluylsulfonic or naphthylsulfonic acid.

A preferred subgroup of structural units of the formula I comprises those in which Y is an oxygen atom, A is linear $C_2$-$C_4$alkylene, preferably ethylene, $R^1$ and $R^2$ are $C_1$- or $C_2$alkyl, especially methyl, and D is a radical of the formula

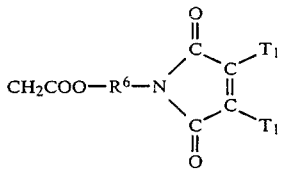

wherein $R^6$ is ethylene, 3-oxapentylene or 1,3-propylene, and $T_1$ is methyl; and $Z^\ominus$ is a halide anion, preferably the chloride anion.

If the polymers of the invention are copolymers, these latter preferably contain, in addition to the chain members which carry maleimide groups, those chain members which are derived from the following comonomers which do not contain maleimide groups: α-olefins, vinyl halides, e.g. vinyl bromide, vinyl chloride and vinyl fluoride; vinylidene, e.g. vinylidene chloride; nitriles of α,β-unsaturated acids, e.g. acrylonitrile or methacrylonitrile; α,β-unsaturated acids, the esters or halogen derivatives thereof, e.g. acrylic acid, methacrylic acid, crotonic acid, maleic acid, methyl methacrylate, ethyl acrylate, propyl acrylate, butyl acrylate, octyl acrylate, 2-ethyl-hexylacrylate, ethyl methacrylate, isopropyl methacrylate, dimethylaminoethyl methacrylate, diethylaminoethyl acrylate, glycidyl methacrylate, glycidyl acrylate or chloromethyl methacrylate, α,β-unsaturated carboxamides and their derivatives, e.g. acrylamide, methylacrylamide; aromatic vinyl compounds, e.g. styrene, methylstyrene, vinyl toluene or α-chlorostyrene; vinyl ketones, e.g. methyl vinyl ketone; vinyl esters, e.g. vinyl acetate; heterocyclic vinyl compounds, e.g. vinyl pyridine, vinyl pyrrolidone; and vinyl ethers.

Ethylenically unsaturated comonomers which contain the maleimide groups defined above are also suitable. Such comonomers can also be used if D is not $C_1$-$C_4$alkyl. Such comonomers are described e.g. in German Offenlegungsschrift No. 26 26 769 and in European patent application No. 0 021 019. They are substantially acrylates and methacrylates, acrymamides and methacrylamides as well as vinyl ethers, which contain the maleimide group linked to the ester, amide or ether group respectively. Preferred comonomers are those of the formulae

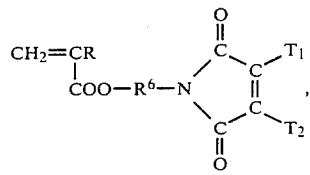

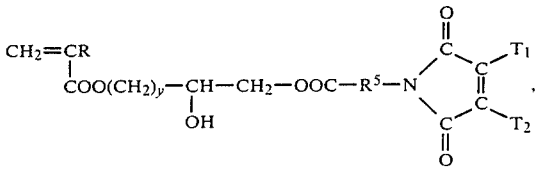

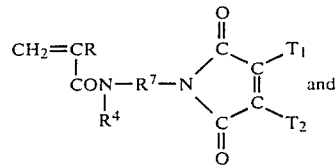

and

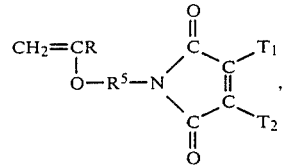

wherein R, $R^4$, $R^5$, $R^6$ and $T_1$ are as defined above and $R^7$ has the same meaning as $R^5$ or is —CO—$R^5$—, and y is 1 or 2.

The polymers of this invention contain preferably 10 to 100 mole %, most preferably 40 to 100 mole %, of structural units containing maleimidyl groups of the formula

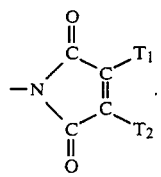

The polymers preferably contain 5 to 90 mole %, most preferably 10 to 60 mole %, of the structural units of the formula I.

The use of different comonomers makes it possible to impart desired properties to the polymers of this invention, e.g. light sensitivity, glass transition temperature, hydrophilic properties, hydrophobic properties, affinity for dyes and solubility.

The properties of the present invention may be prepared by different known methods.

In one embodiment of the invention, homopolymers and copolymers containing at least one ethylenically unsaturated comonomer which contains a maleimidyl group for $D=C_1-C_4$alkyl, and containing structural units of the formula II or III

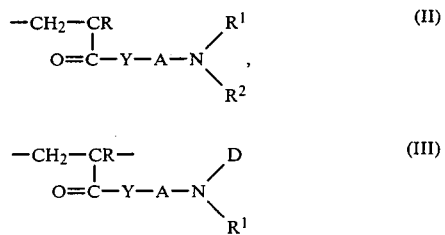

are reacted with a quaternising agent of the formula DZ or $R^2Z$, in an organic solvent and optionally with heating, to a temperature of about 100° C. The starting polymers are obtained by known polymerisation methods from the corresponding monomers and, where required, comonomers, described e.g. in German Offenlegungsschrift No. 26 26 769.

The quaternising agents DZ are novel and also constitute an object of the invention. They are prepared by known methods, e.g. by esterifying or amidating compounds of the formula

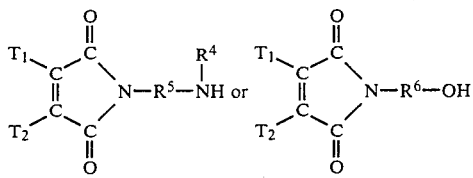

with haloacetic acid or their ester- or amide-forming derivatives. The reaction with hydroxyacetic acid gives corresponding hydroxy derivatives which, as well as compounds of the formula

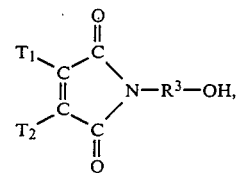

can be converted in known manner into halogen derivatives, sulfonates and sulfates.

In a further embodiment of the process for preparing the polymers of the invention, unsaturated monomers of the formula IV

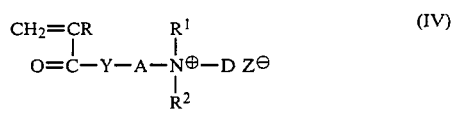

optionally together with at least one ethylenically unsaturated comonomer which contains a maleimidyl group for $D=C_1-C_4$alkyl, can be polymerised in organic solution, in a manner known per se, in the presence of a radical initiator, e.g. azobisisobutyronitrile, in the temperature range from about 40° to 120° C.

The compounds of the formula IV, in which D is not $C_1-C_4$alkyl, and which are obtained by quaternisation of compounds of the formula

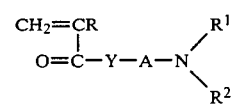

with DZ, are novel and likewise constitute an object of the invention.

In a particularly advantageous embodiment, the polymers of this invention can be prepared by a novel process which also constitutes an object of the invention. This process comprises polymerising a monomer of the formula V or VI

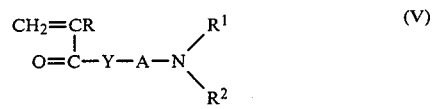

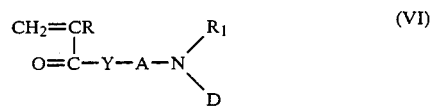

by itself or together with at least one ethylenically unsaturated comonomer which contains a maleimidyl group for $D=C_1-C_4$alkyl, in organic solution and in the presence of a radical initiator and a quaternising agent DZ or $R^2Z$. The polymers can thus be prepared economically in a single process step by simultaneous polymerisation and quaternisation without any possible crosslinking reactions being observed. To carry out the reaction, the reactants are heated with a radical initiator, such as azobisisobutyronitrile, in an organic solvent. The temperature depends substantially on the radical initiator employed and may be e.g. in the range from 40° to 120° C.

Examples of suitable solvents for the process are alcohols such as methanol, ethanol and methyl cellosolve, as well as polar aprotic solvents. The solvents may be employed singly or in mixtures of at least two solvents. Examples are: ethers such as diethyl ether, dibutyl ether, tetrahydrofuran, dioxan, methyl ethylene glycol, dimethyl ethylene glycol, dimethyl diethylene glycol, diethyl diethylene glycol, dimethyl triethylene glycol; halogenated hydrocarbons such as methylene chloride, chloroform, carbon tetrachloride, 1,2-dichloroethane, 1,1,2-trichloroethane, 1,1,2,2-tetrachloroethane, carboxylates and lactones such as ethyl acetate, methyl propionate, ethyl benzoate, 2-methoxyethyl acetate, γ-butyrolactone, γ-valerolactone and mevaloactone; carboxamides and lactams such as formamide, acetamide, N-methylformamide, N,N-dimethylformamide, N,N-diethylformamide, N,N-dimethylacetamide, N,N-diethylacetamide, γ-butyrolactam, γ-caprolactam, N-methylpyrrolidone, N-methylcaprolactam, tetramethylurea, hexamethylphosphoric amide; sulfoxides such as dimethylsulfoxide, tetramethylsulfoxide; sulfones such as dimethylsulfone, diethylsulfone, trimethylenesulfone, tetramethylenesulfone; primary, secondary and tertiary amines such as methylamine, ethylamine, propylamine, pyrrolidine, piperidine, morpholine, dimethylamine, diethylamine, methylethylamine, trimethylamine, triethylamine, N-methylpyrrolidine, N-methylpiperidine, N-methylmorpholine; substituted benzenes such as chlorobenzene, nitrobenzene and cresol.

The polymer solutions, optionally after dilution and addition of conventional additives, can be used as light-sensitive coating compositions. However, the polymer can also be isolated from the solutions by conventional methods, e.g. by precipitation with a non-solvent, concentration by freezing, or distilling off the solvent. The polymers and their solutions are storage stable.

Owing to the presence of maleimide groups, the polymers of this invention are particularly suitable for crosslinking under the action of electromagnetic waves. The crosslinking results in the formation of insoluble products. Relief images can be obtained by imagewise exposure and subsequent development (dissolving out the uncrosslinked and unexposed polymer component). In addition to being used as photographic material, the polymers can also be used for the surface protection of different substrates such as plastics, metals, glass, wood and ceramics. The polymers adhere well to the substrate.

Conventional additives which do not adversely affect the light-sensitivity may be incorporated in the polymers or the corresponding coating compositions. Examples of such additives are dulling agents, crosslinking agents and levelling agents, fillers, dyes or pigments, flame retardants, light stabilisers and antioxidants.

Without sensitisers, the polymers of the present invention have a maximum light sensitivity in the range from 200 to 320 μm. The light sensitivity can be appreciably increased by appropriate choice of sensitisers and can be optimally adapted to the light of different commercially available copying lampes, e.g. metal halide lamps.

Suitable sensitisers are described in German Offenlegungsschrift No. 26 26 769. Preferred sensitisers are substituted thioxanthones which are disclosed e.g. in German Offenlegungsschrift No. 30 18 891, e.g. alkyl esters of 3-carboxy-7-methylthioxanthone. The sensitisers are preferably employed in amounts from 0.5 to 10% by weight, based on the polymer. Mixtures of different sensitisers can also be used.

The invention also relates to the light-sensitive materials obtained from the polymers of this invention. Such materials are e.g. photographic recording materials for the printing industry, formes, special offset formes, as well as materials for the field of photomanufacture in electronics, e.g. photoresists for the production of printed circuits.

To this end the polymers are dissolved in organic solvents and, after the addition of different auxiliaries, applied to the supports. The supports are those customarily employed for the respective field of application. For photographic recording materials the supports are e.g. polyester or cellulose acetate sheets or plastic-coated papers; for offset forms, specially treated aluminium is used, while copper-clad laminates are used for making printed circuits.

Coating can be effected by conventional known methods, e.g. by immersion, knife-coating, curtain coating, brush coating, spraying and reverse roller coating.

After the coating application, the solvent is removed by drying to give a non-tacky, solid layer of light-sensitive polymer on the support. After conventional imagewise exposure of the material through a photomask, the unexposed areas of the polymer are removed by dissolving them out in a developer and the polymer relief, consisting of crosslinked polymer, is revealed.

The preferred developer is ordinary mains water. In addition to water, however, it is also possible to use mixtures of water with water-miscible organic solents (alcohols, ketones, esters) and, in certain cases, also organic solvents, e.g. ethyl alcohol. The temperature of the developer solution can vary from +5° C. to about 90° C., preferably from 15° to 60° C. The developing time depends on the layer thickness and the composition of the polymer, and can be from about 10 seconds to about 10 minutes. Images of good adherence and excellent quality are obtained.

The following Examples illustrate the invention in more detail.

(A) PREPARATION OF THE INTERMEDIATES

Example 1

N-(chloromethylcarbonyloxyethyl)dimethylmaleimide

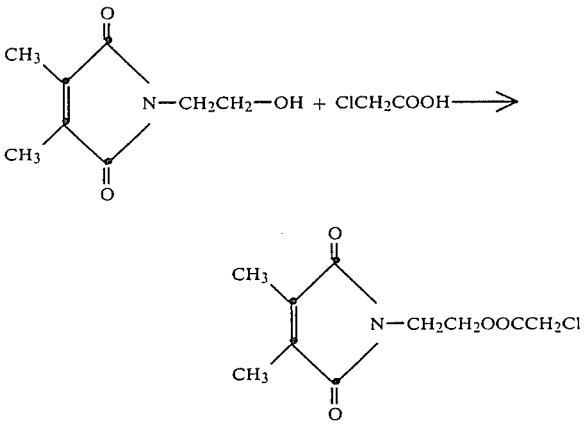

With stirring, 169.2 g (1 mole) of N-(2-hydroxyethyl)-dimethylmaleimide, 113.4 g (1.2 moles) of chloroacetic acid and 11.8 g of concentrated sulfuric acid are heated to reflux in 1000 ml of toluene using a water separator. The formation of water ceases after about 2 hours and 18 ml have separated. The reaction solution is washed with saturated sodium bicarbonate solution and water. The organic phase is dried over magnesium sulfate and concentrated in a rotary evaporator at 40° C. The residue is dried for 2 hours at 60° C./0.1 mm, affording 206 g of a colourless liquid.

Elemental analysis: $C_{10}H_{12}ClNO_4$ (245.67). Calc.: C 48.89, H 4.92, N 5.70. Found: C 48.88, H 5.05; N 5.58.

Example 2

N-(chloromethylcarbonyloxy-2,2-dimethylpropyl)-dimethylmaleimide

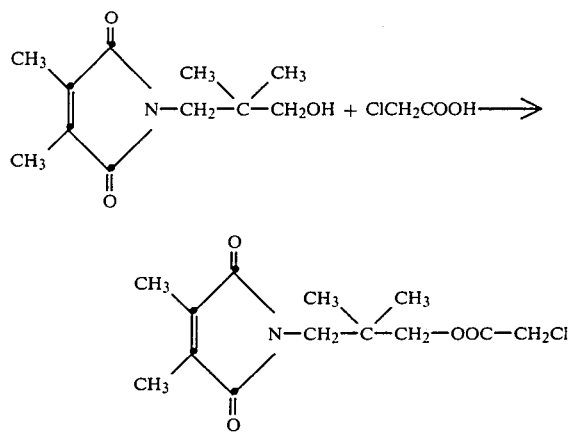

A mixture of 105.6 g (0.5 mole) of N-(2,2-dimethyl-3-hydroxypropyl)dimethylmaleimide, 56.7 g (0.6 mole) of chloroacetic acid, 5.9 g of concentrated sulfuric acid and 400 ml of toluene are heated as described in Example 1 until the formation of water (9 ml) has ceased. The reaction solution is worked up as in Example 1, affording 121 g of a colourless liquid.

Elemental analysis: $C_{13}H_{18}ClNO_4$ (287.75). Cal.: C 54.27, H 6.31, N 4.87, Cl 12.32. Found: C 54.24, H 6.13, N 4.92, Cl 12.13.

Example 3

N-(chloromethylcarbonyloxy-3-oxapentyl)dimethylmaleimide

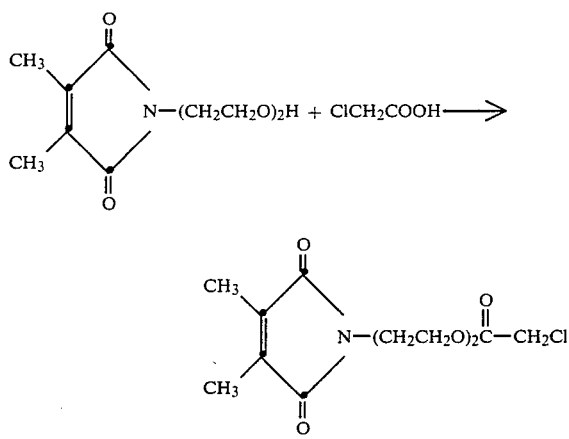

A mixture of 90.6 g (0.41 mole) of N-(5-hydroxy-3-oxapentyl)dimethylmaleimide, 46.6 g of chloroacetic acid, 4.8 g of concentrated sulfuric acid and 400 ml of toluene are reacted and worked up as described in Example 1, affording 112 g of a slightly yellowish liquid.

Elemental analysis: $C_{12}H_{16}ClNO_5$ (289.72). Cal.: C 49.75, H 5.57, N 4.84, Cl 12.24. Found: C 50.00, H 5.58, N 5.01, Cl 12.13.

Example 4

N-(chloromethylcarbonyloxyhexyl)dimethylmaleimide

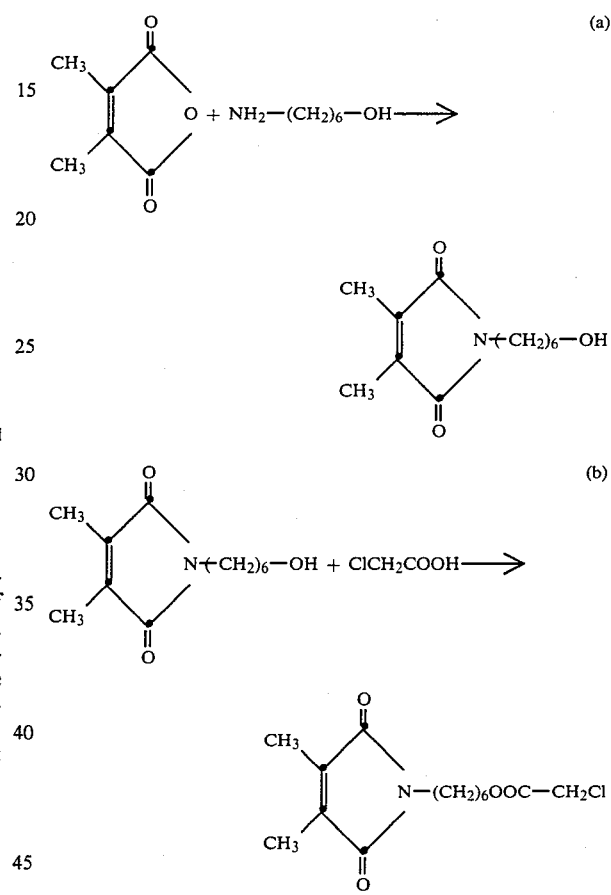

(a) In a 500 ml glass round-bottomed flask equipped with magnetic stirrer and reflux cooler, a mixture of 104.7 g (0.83 mole) of dimethylmaleic anhydride, 96.7 g (0.81 mole) of 6-amino-1-hexanol and 100 ml of toluene is stirred for 4 hours at reflux temperature. Volatile constituents are first removed from the reaction solution in a water jet vacuum (bath temperature up to 100° C.), and then the solution is fractionated over a short column in an oil pump vacuum. The main fraction consists of 176 g of N-(6-hydroxyethyl)dimethylmaleimide in the form of a colourless oil with a boiling point of 130° to 141° C./0.05 mm.

(b) A mixture of 67.6 g (0.30 mole) of N-(6-hydroxyhexyl)dimethylmaleimide, 34.0 g (0.36 mole) of chloroacetic acid, 3.5 g of concentrated sulfuric acid and 300 ml of toluene is reacted and worked up as described in Example 1. The residue consists of 86.6 g of a colourless oil.

Elemental analysis: $C_{14}H_{20}ClNO_4$ (301.77). Cal.: C 55.72, H 6.68, N 4.64, Cl 11.75. Found: C 56.80, H 6.79, N 4.34, Cl 11.55.

(B) PREPARATION OF THE POLYMERS

Example 5

(a) Copolymer of methylmethacrylate (MMA) and dimethylaminoethylmethacrylate (DMAEMA) (molar ratio of the monomers: MMA/DMAEMA=1.8:1.0)

A thermostatically controllable double-jacket glass reactor equipped with stirrer, thermometer, vacuum connection and nitrogen inlet is charged with the following mixture:

36.0 g of MMA
31.4 g of DMAEMA
270.0 g of ethanol
0.337 g of azobisisobutyronitrile (AIBN).

Oxygen is removed by repeated evacuation and blanketing with pure nitrogen. The polymerisation is initiated by heating to a temperature of 60°±1° C. in the flask and carried out for 24 hours at this temperature. The viscous polymer solution is precipitated in a total of 3500 ml of water by means of a mixer and the solid colourless polymer powder is dried for 3 days in a vacuum drying cabinet at c. 50° C./100 torr. Yield: 59 g of polymer having an amine content of 2.68 val/kg (theory: 2.94 val/kg).

(b) Quaternisation of the polymer

A mixture consisting of
10.0 g of the above polymer
8.6 g of N-(chloromethylcarbonyloxy-3-oxapentyl)-dimethylmaleimide obtained in Example 3
95.0 g of dimethylformamide is heated in a glass flask equipped with magnetic stirrer for 1 hour at 60° C. and then for 24 hours at 80° C. The yellowish viscous polymer solution is precipitated by stirring it vigorously into 2000 ml of ethyl acetate and the precipitate is dried at 40° C. in a vacuum drying cabinet with the exclusion of light.

Yield: 16.8 g of polymer powder which, when analysed, contains 4.3% of Cl. This corresponds to 1.21 val/kg of quaternary ammonium groups (theory: 1.51 val/kg). The polymer is soluble in water.

Example 6

Copolymer of MMA/DMAEMA in the ratio 1.8:1, quaternised with the compound of Example 1

10.0 g of the polymer of Example 5a
7.3 g of N-(chloromethylcarbonyloxyethyl)dimethyl-maleimide of Example 1
95.0 ml of dimethylformamide are reacted as in Example 1b.

Yield: 14.2 g of solid polymer which, when analysed, contains 4.5% of Cl. This corresponds to 1.27 val/kg of quaternary ammonium groups (theory: 1.62 val/kg). Inherent viscosity (0.5% in methyl cellosolve, 25° C.)=1.04 dl/g.

Example 7

Polymerisation and quaternisation

Polymer from:

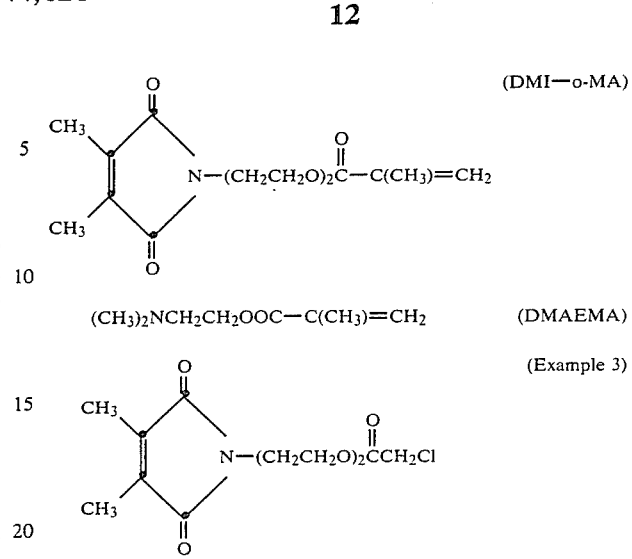

500 ml glass ampoules equipped with magnetic stirrer are charged with the mixtures listed below and the oxygen is removed by repeated evacuation and blanketing with pure nitrogen. The ampoules are heated for 24 hours in a heating bath which is thermostabilised to 65° C., then cooled, and the contents are poured into 2000 ml of ether. The polymers are obtained as rubbery substances. The ether is removed by decantation, then fresh ether is added and the polymer is dried at 40° C./100 mm in a vacuum drying cabinet. The combined ether phases are concentrated by rotary evaporation, the residue is weighed and yield is calculated therefrom.

7.1:
28.1 g of DMI-o-MA
4.7 g of DMAEMA
8.7 g of the compound of Example 3
0.16 g of azobisisobutyronitrile
76.5 g of dimethylformamide
Yield=96%. The polymer is soluble in water.

7.2:
28.1 g of DMI-o-MA
3.1 g of DMAEMA
5.8 g of the compound of Example 3
0.16 g of azobisisobutyronitrile
72.0 g of dimethylformamide
Yield=96%. The polymer is soluble in water.

7.3:
28.1 g of DMI-o-MA
3.9 g of DMAEMA
7.2 g of the compound of Example 3
0.16 g of azobisisobutyronitrile
74.7 g of dimethylformamide In contrast to 7.1 and 7.2, the polymer 7.3 is not precipitated in ether. Instead, the reaction solution is further used direct for the preparation of light-sensitive materials.

Example 8

Polymerisation and quaternisation

Polymer from

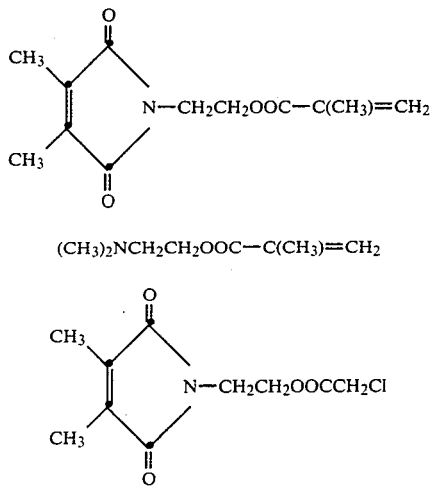

(DMI—MA)

(DMAEMA)

(Example 1)

The following mixtures are polymerised as in Example 7:

8.1:
23.7 g of DMI-MA
7.86 g of DMAEMA
12.28 g of the compound of Example 1
0.16 g of azobisisobutyronitrile
73.7 g of dimethylformamide Cl content (after analysis)=4.9%, corresponding to 1.38 val/kg of quaternary ammonium groups (theory: 1.14 val/kg).

8.2:
23.7 g of DMI-MA
6.3 g of DMAEMA
0.83 g of the compound of Example 1
0.20 g of azobisisobutyronitrile
93.0 g of dimethylformamide
Yield=93%.

Example 9

Polymerisation and quaternisation

Polymer from

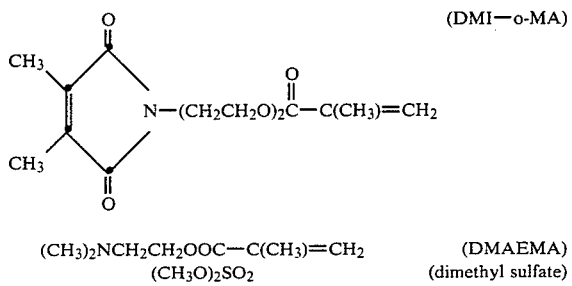

(DMI—o-MA)

(DMAEMA)
(dimethyl sulfate)

The following mixture is polymerised as in Example 7:

28.1 g of DMI-o-MA
3.1 g of DMAEMA
2.52 g of dimethylsulfate
0.16 g of azobisisobutyronitrile
72.8 g of dimethylformamide
Yield=97%. The polymer is soluble in water.

Application Examples

The sensitiser used in the following Examples and abbreviated to CMTX (3-carbethoxy-7-methylthioxanthone) has the following structure

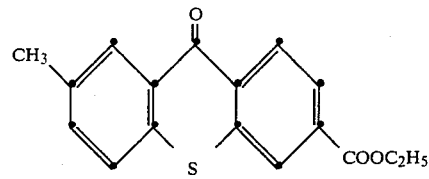

All tests are carried out under yellow light.

EXAMPLE 10

The following coating solution is prepared:
4.0 g of quaternised polymer of Example 5
16.0 g of ethylene glycol monomethyl ether
0.200 g of CMTX.

Using a wire film applicator, this solution is coated to a wet film thickness of 20 μm onto a biaxially stretched 100 μm polyester sheet and dried for 5 minutes at 85° C. The homogeneous, slightly yellowish light-sensitive layer has a thickness of about 3-4 μm.

The films are exposed on a copying machine (Océ Helioprint 36, 1000 W metal halide lamp at a distance of 53 cm) for 30 seconds in contact with a test wedge.

The exposed strips are developed by immersing them for 30 seconds in lukewarm water (35° C.) and then for 3 minutes in a 2% aqueous solution of the dye of the formula

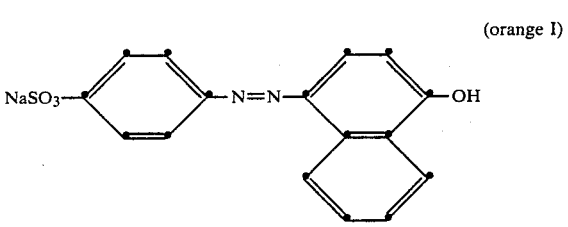

(orange I)

The strips are then washed for 15 seconds in running water and dried. An intense orange image which has an optical density of 1.7 at 465 μm is obtained.

EXAMPLE 11

The following coating solution:
4.0 g of the quaternised polymer of Example 6
16.0 g of ethylene glycol monomethyl ether
0.200 g of CMTX
is coated on polyester as described in Example 11, exposed, developed for 30 seconds with water of 30° C. and coloured. An intense orange image which has an optical density of 3.1 at 465 μm is obtained.

EXAMPLE 12

The following coating solution is prepared:
3.0 g of the polymer of Example 7.1
7.0 g of a 1:1 mixture of methanol/methylene chloride
0.060 g of CMTX.

This solution is coated with a wire film applicator to a wet film thickness of 120 μm onto a copper-clad laminate which is used for making printed circuit boards, and dried for 20 minutes at 40° C. The photopolymer layer thickness of this coated printed circuit board is about 35 μm. The board is exposed in the copying machine described in Example 10 through a partial wedge for 2 minutes and developed by washing for 2 minutes in running water of 30° C. The series of conductors can then be reinforced on this board in known manner by deposition of copper in a galvanising bath, without the photoresist being attacked. Subsequently the photoresist can be stripped off by treatment with warm 5% sodium hydroxide solution.

EXAMPLE 13

The following coating solution is prepared:
4.0 g of the polymer of Example 7.2
16.0 g of ethylene glycol monomethyl ether
0.320 g of CMTX.

Using a wire film applicator, this solution is coated to a wet thickness of 20 μm onto a copper-clad laminate which is used for making printed circuit boards, and dried for 3 minutes at 85° C. The circuit board is exposed for 30 seconds as in Example 10 and developed by agitating it in water of 35° C. for 2 minutes. Then the printed conductor pattern is produced by cauterising in known manner with iron(III) chloride. The photoresist is not attacked by the caustic solution. If desired, it can be stripped off by treatment with warm sodium hydroxide solution.

EXAMPLE 14

The following coating solution is prepared:
20.0 g of the polymer solution is dimethylformamide prepared as in Example 3
0.140 g of CMTX
0.420 g of citric acid.

Using a wire film applicator, this solution is coated to a wet film thickness of 120 μm onto a copper-clad laminate used for making printed circuit boards, and dried for 25 minutes at 85° C. The board is exposed for 3 minutes as in Example 10 and developed for 2 minutes with water of 35° C. using a hand spray. The developed photoresist can then be used as a galvanoresist as in Example 12. It withstands very well attack by the strongly acidic galvanising bath and gives printed conductor patterns of high quality.

What is claimed is:

1. A homopolymer or copolymer containing maleimidyl and quaternary ammonium groups and having a molecular weight of at least 1000, which polymer contains structural units of the formula I $$-CH_2-CR- \quad R^1 \atop O=C-Y-A-N^{\oplus}-D \; Z^{\ominus}, \atop R^2$$ (I)

wherein
R is a hydrogen atom or a methyl group,
Y is an oxygen atom or the —NH group,
A is a linear or branched $C_2$-$C_6$ alkylene group,
$R_1$ and $R_2$ independently of each other are $C_1$-$C_4$ alkyl or together are tetramethylene, pentamethylene or 3-oxapentylene,
D is a radical of the formula

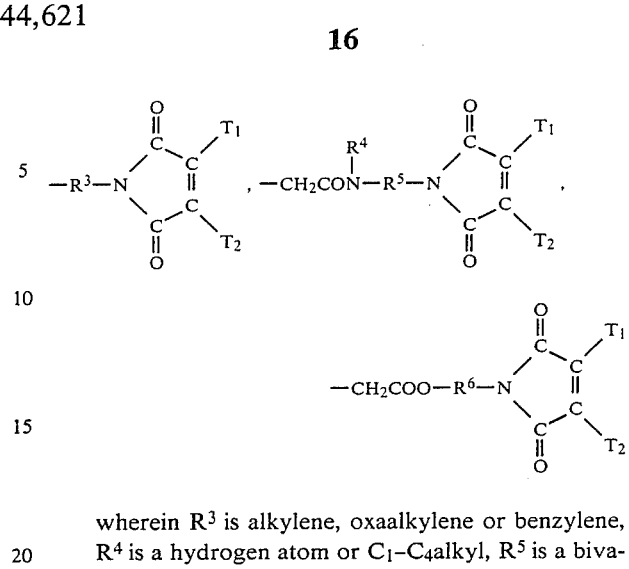

wherein $R^3$ is alkylene, oxaalkylene or benzylene, $R^4$ is a hydrogen atom or $C_1$-$C_4$alkyl, $R^5$ is a bivalent aliphatic, cycloaliphatic or aromatic hydrocarbon radical or a bivalent aliphatic or aromatic heterocyclic radical containing up to 18 carbon atoms, and $R^6$ has the meaning of $R^5$ or is

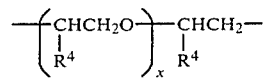

wherein x is a value from 1 to 29 and $R^4$ is hydrogen atom or $C_1$-$C_4$alkyl; and $T_1$ and $T_2$ independently of each other are $C_1$-$C_4$alkyl or together are unsubstituted or $C_1$-$C_4$alkyl-substituted trimethylene or tetramethylene, and $Z^{\ominus}$ is an anion.

2. A polymer according to claim 1, which contains 5 to 90 mole % of the structural units of the formula I, based on the polymer.

3. A polymer according to claim 1, which contains 10 to 100 mole %, based on the polymer, of structural units containing maleimidyl groups of the formula

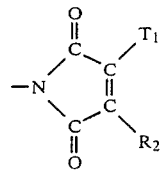

wherein $T_1$ and $T_2$ have the given meanings.

4. A polymer according to claim 1, which contains as structural units of comonomers carrying maleimidyl groups those of the formulae

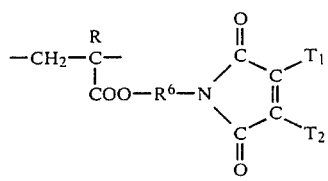

-continued

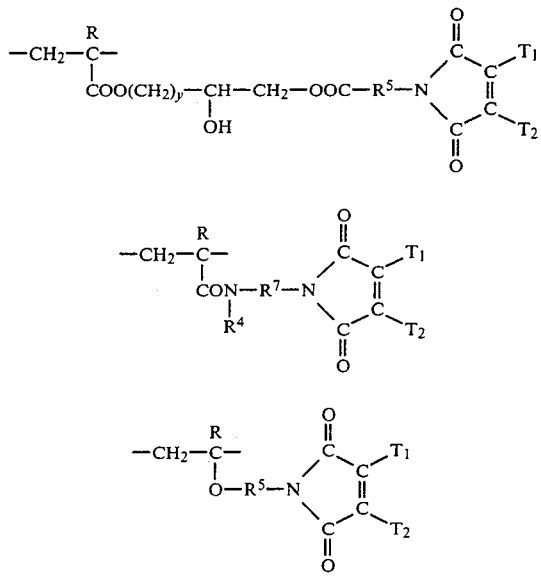

wherein R, $R^4$, $R^5$, $R^6$ and $T_1$ are as defined in claim 1, $R^7$ has the same meaning as $R^5$ or is

and y is 1 or 2.

5. A polymer according to claim 1, which additionally contain structural units of comonomers selected from the group consisting of α-olefins, vinyl halides, aromatic vinyl compounds, heterocyclic vinyl compounds, vinyl ketones, vinyl esters, vinyl ethers and α,β-unsaturated nitriles, carboxylic acid esters and carboxylic acid amides.

6. A polymer according to claim 1, wherein $R^5$ as an aliphatic radical is alkylene or oxaalkylene containing 1 to 12 carbon atoms, and as a cycloaliphatic radical contains 5 or 6 ring atoms, as a carbocyclic-aromatic radical contains 6 to 16 carbon atoms, as an araliphatic radical contains 7 to 16 carbon atoms, and as a heterocyclic-aromatic or heterocyclic-aliphatic radical contains 4 to 12 carbon atoms.

7. A process for the preparation of a polymer according to claim 1, which comprises
(a) reacting a homopolymer or copolymer containing structural units of the formula II or III

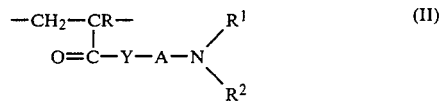

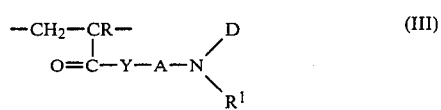

with a quaternising agent of the formula D-Z or $R^2Z$, in which formulae R, $R^1$, $R^2$, Y, A, D and Z are as defined in claim 1, in an organic solvent, or
(b) polymerising a monomer of the formula IV

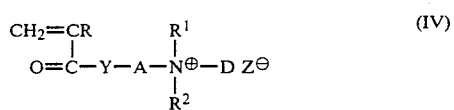

by itself or together with an ethylenically unsaturated comonomer, in organic solution and in the presence of a radical initiator, or
(c) polymerising a monomer of the formula V or VI

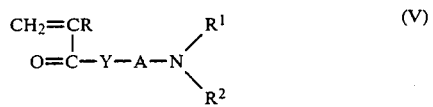

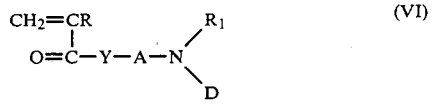

by itself or together with an ethylenically unsaturated comonomer, in organic solution and in the presence of a radical initiator and of an quaternising agent DZ or $R^2Z$, in which formulae R, $R^1$, $R^2$, Y, A, D and Z are as defined in claim 1.

8. A photograhic recording material comprising a support to which has been applied direct a layer of a polymer according to claim 1.

* * * * *